United States Patent
Chen et al.

(10) Patent No.: US 9,465,050 B2
(45) Date of Patent: Oct. 11, 2016

(54) ASSEMBLING METHOD AND MAINTAINING METHOD FOR VERTICAL PROBE DEVICE

(71) Applicant: MPI CORPORATION, Chu-Pei, Hsinchu Shien (TW)

(72) Inventors: Tsung-Yi Chen, Chu-Pei (TW); Horng-Kuang Fan, Chu-Pei (TW); Ching-Hung Yang, Chu-Pei (TW); Chung-Tse Lee, Chu-Pei (TW); Chia-Yuan Kuo, Chu-Pei (TW); Tien-Chia Li, Chu-Pei (TW); Ting-Ju Wu, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 56 days.

(21) Appl. No.: 14/643,780

(22) Filed: Mar. 10, 2015

(65) Prior Publication Data

US 2015/0253358 A1   Sep. 10, 2015

(30) Foreign Application Priority Data

Mar. 10, 2014   (TW) .............................. 103108187 A

(51) Int. Cl.
*G01R 31/01*   (2006.01)
*G01R 3/00*    (2006.01)
(Continued)

(52) U.S. Cl.
CPC ............. *G01R 3/00* (2013.01); *G01R 1/07314* (2013.01); *G01R 1/073* (2013.01); *G01R 1/0735* (2013.01);
(Continued)

(58) Field of Classification Search
CPC .... G01R 3/00; G01R 1/073; G01R 1/07314; G01R 1/07307; G01R 1/0735; G01R 31/2601
USPC .......................... 324/750.22, 754.01–754.14, 324/755.01–755.11, 762.01–762.1; 29/592.1, 593, 603.09, 525.11, 739
See application file for complete search history.

(56) References Cited

U.S. PATENT DOCUMENTS 5,499,913 A * 3/1996 Hagino ................... B28B 3/269
                                                    264/177.12
5,530,371 A * 6/1996 Perry ................. G01R 1/07378
                                                    324/756.03
(Continued)

FOREIGN PATENT DOCUMENTS

CN   103547138   1/2014
TW   200610967   4/2006
(Continued)

OTHER PUBLICATIONS

Huang et al., High Density Vertical Probe Card Fabrication with Low Cost and High Precision Characteristics by Using MEMS process, Institute of Mechanical and Electrical Engineering, National Taipei University of Technology, 2005 Electronics Packaging Technology Conference, IEEE 2005.*

*Primary Examiner* — Arleen M Vazquez
*Assistant Examiner* — Sean Curtis
(74) *Attorney, Agent, or Firm* — Muncy, Geissler, Olds & Lowe, P.C.

(57) ABSTRACT

An assembling method for a vertical probe device includes steps of disposing a lower die on a jig by inserting supporting columns through jig holes of the lower die, fastening a positioning film on the supporting columns, installing probe needles and an upper die in a way that the positioning film is located between the upper and lower dies without contacting the upper die, unfastening the positioning film, and removing the jig so that the upper and lower dies, positioning film and probe needles constitute the device. A maintaining method for the device includes steps of inserting the supporting columns through the jig holes, fastening the positioning film to the jig, and removing the upper die. The probe needles and upper die are easily removed and installed and the probe needles are reliable. The vertical probe device is applicable for accommodating electronic components on the top thereof.

9 Claims, 13 Drawing Sheets

(51) Int. Cl.
*G01R 1/073* (2006.01)
*G01R 31/26* (2014.01)

(52) U.S. Cl.
CPC ....... *G01R 1/07307* (2013.01); *G01R 31/2601* (2013.01); *Y10T 29/49117* (2015.01); *Y10T 29/49718* (2015.01); *Y10T 29/49895* (2015.01)

(56) References Cited

U.S. PATENT DOCUMENTS

| | | | | |
|---|---|---|---|---|
| 5,850,148 A * | 12/1998 | Nam | | G01R 1/07314 324/750.25 |
| 6,144,212 A * | 11/2000 | Mizuta | | G01R 1/07378 324/755.04 |
| 6,242,929 B1 * | 6/2001 | Mizuta | | G01R 1/07357 324/754.07 |
| 6,292,003 B1 * | 9/2001 | Fredrickson | | G01R 1/0483 324/750.25 |
| 6,566,898 B2 * | 5/2003 | Theissen | | G01R 1/07307 324/750.03 |
| 6,633,175 B1 * | 10/2003 | Evans | | G01R 3/00 324/756.03 |
| 6,661,244 B2 * | 12/2003 | McQuade | | G01R 1/07307 324/756.03 |
| 6,756,797 B2 * | 6/2004 | Brandorff | | G01R 1/07378 324/754.07 |
| 6,853,208 B2 * | 2/2005 | Okubo | | G01R 3/00 324/756.03 |
| 7,282,936 B2 * | 10/2007 | Brandorff | | G01R 31/2887 324/750.25 |
| 7,349,223 B2 * | 3/2008 | Haemer | | G01R 1/07314 29/593 |
| 7,388,392 B2 * | 6/2008 | Brandorff | | G01R 31/2887 324/756.04 |
| 7,400,156 B2 * | 7/2008 | Wu | | G01R 1/07357 324/750.21 |
| 7,479,237 B2 * | 1/2009 | Tsai | | G01R 1/07371 216/58 |
| 7,898,242 B2 * | 3/2011 | Eldridge | | G01R 31/2889 324/756.03 |
| 8,264,248 B2 * | 9/2012 | McQuade | | G01R 1/06738 324/755.06 |
| 8,723,538 B2 * | 5/2014 | Hung | | G01R 1/07371 324/750.16 |
| 8,933,719 B2 * | 1/2015 | Huang | | G01R 1/07342 257/48 |
| 9,110,130 B2 * | 8/2015 | Chen | | G01R 31/2889 |
| 9,222,961 B1 * | 12/2015 | Lin | | G01R 1/07314 |
| 2002/0153913 A1 * | 10/2002 | Okubo | | G01R 1/06716 324/754.07 |
| 2004/0124862 A1 * | 7/2004 | Sugawara | | G01R 1/07357 324/750.25 |
| 2005/0012513 A1 * | 1/2005 | Cheng | | G01R 1/07342 324/755.05 |
| 2005/0110506 A1 * | 5/2005 | Crippa | | G01R 1/06733 324/754.11 |
| 2006/0066328 A1 * | 3/2006 | Clegg | | G01R 1/07357 324/755.06 |
| 2007/0007977 A1 * | 1/2007 | Eldridge | | G01R 31/2889 324/756.03 |
| 2007/0115012 A1 * | 5/2007 | Cheng | | G01R 1/07371 324/750.25 |
| 2007/0145988 A1 * | 6/2007 | Garabedian | | G01R 1/07378 324/750.22 |
| 2008/0048685 A1 * | 2/2008 | Chui | | G01R 1/07314 324/754.07 |
| 2008/0174326 A1 * | 7/2008 | Jeon | | G01R 1/07342 324/754.07 |
| 2008/0238408 A1 * | 10/2008 | McQuade | | G01R 1/06738 324/149 |
| 2008/0238452 A1 * | 10/2008 | McQuade | | G01R 1/0675 324/755.01 |
| 2009/0096474 A1 * | 4/2009 | Rogers | | G01R 1/0735 324/750.19 |
| 2009/0212798 A1 * | 8/2009 | Kasukabe | | G01R 1/06727 324/754.07 |
| 2009/0212805 A1 * | 8/2009 | Chen | | G01R 1/06755 324/755.01 |
| 2011/0128028 A1 * | 6/2011 | Lin | | G01R 3/00 324/756.03 |
| 2011/0156735 A1 * | 6/2011 | Breinlinger | | G01R 1/0491 324/750.19 |
| 2011/0221465 A1 * | 9/2011 | Lee | | G01R 1/07342 324/756.03 |
| 2012/0007627 A1 * | 1/2012 | Chen | | G01R 31/2889 324/756.03 |
| 2012/0023730 A1 * | 2/2012 | Chong | | G01R 1/07342 29/428 |
| 2012/0025859 A1 * | 2/2012 | Huang | | G01R 1/07342 324/755.01 |
| 2013/0069683 A1 * | 3/2013 | Kuo | | G01R 1/0491 324/755.03 |
| 2013/0069686 A1 * | 3/2013 | Wu | | G01R 3/00 324/756.03 |
| 2013/0147502 A1 * | 6/2013 | Audette | | G01R 1/067 324/750.08 |
| 2014/0197860 A1 * | 7/2014 | Hsu | | G01R 1/07357 324/756.07 |
| 2014/0306729 A1 * | 10/2014 | Chen | | G01R 31/2889 324/750.22 |
| 2014/0306730 A1 * | 10/2014 | Chen | | G01R 1/07378 324/750.25 |
| 2015/0015287 A1 * | 1/2015 | DeBauche | | G01R 3/00 324/750.25 |
| 2015/0253358 A1 * | 9/2015 | Chen | | G01R 3/00 29/825 |

FOREIGN PATENT DOCUMENTS

| | | |
|---|---|---|
| TW | I299085 | 7/2008 |
| TW | 201120452 | 6/2011 |
| TW | I442053 | 6/2014 |

* cited by examiner

ASSEMBLING METHOD AND MAINTAINING METHOD FOR VERTICAL PROBE DEVICE

BACKGROUND OF THE INVENTION

1. Field of the Invention

The present invention relates generally to vertical probe devices and more particularly, to an assembling method and a maintaining method for a vertical probe device, and the vertical probe device for performing the aforesaid methods.

2. Description of the Related Art

Taiwan Patent No. 1299085, which corresponds to U.S. Pat. No. 7,400,156, disclosed a vertical probe device which comprises a probe seat composed of upper and lower dies or upper, middle and lower dies, a positioning film disposed between the upper and lower dies, and a plurality of probe needles. Each probe needle has a head penetrating through the upper die and the positioning film, a tail penetrating through the lower die, and a curved body located in an accommodating space defined between the upper and lower dies. When contacting contacts of devices under test (hereinafter referred to "DUTs") with different heights, the tails of the probe needles are movable vertically to adjust heights of needle-points thereof to the heights of the contacts, respectively. The positioning film is adapted for positioning the heads of the probe needles before the upper die is installed, so that the probe needles will not oblique and therefore the upper die will be installed positively and smoothly.

In a conventional arrangement, the positioning film is suspended in the above-mentioned accommodating space. However, in this way, if the upper die needs to be removed temporarily for replacement of the probe needles, the positioning film is liable to be lifted and flipped over while the upper die is removed. Meanwhile, the probe needles might be pulled up along with the positioning film that is flipped over. In this case, reinstalling the pulled-up probe needles is time-consuming; besides, the probe needles might be damaged when being pulled up.

In another conventional arrangement, the positioning film is fastened on a top surface of the lower die, such that the positioning film is prevented from being lifted and flipped over. However, in this way, the positioning film is unmovable when the probe needles receive external force, resulting in that the probe needles may bear relatively greater stress and thereby being easily damaged.

In the vertical probe device disclosed in the aforesaid Taiwan Patent No. 1299085, the positioning film is placed on the lower die and movable in a small distance between the upper and lower dies. Besides, the positioning film can be fastened on the lower die by bolts, if necessary. Therefore, while the upper die is removed, the positioning film can be fastened on the lower die and thereby prevented from being lifted and flipped over. In another aspect, the top surface of the upper die of the probe device will be connected with a circuit board or a space transformer, which might be provided at the bottom surface thereof with electronic components, and therefore the electronic components will occupy some space around the top of the probe device. In other words, the probe device might need to be provided at the top thereof with some reserved areas for accommodating electronic components. However, the reserved areas usually overlap the areas for fastening the positioning film to the lower die. Therefore, the vertical probe device disclosed in the aforesaid patent is not applicable in the situation that the top thereof should accommodate electronic components.

In addition, Taiwan Patent Publication No. 201120452, which corresponds to US Publication No. 2011/0128028, disclosed a maintenance device which is adapted to be installed in a probe device for fastening the positioning film of the probe device, thereby preventing the positioning film from being lifted and flipped over. However, although the maintenance device has the effect of fastening the positioning film, it is composed of so many elements as to be complicated in construction and time-consuming in installation.

SUMMARY OF THE INVENTION

The present invention has been accomplished in view of the above-noted circumstances. It is an objective of the present invention to provide an assembling method and a maintaining method for a vertical probe device, and the vertical probe device for performing the methods, which are effective in solving the aforesaid problems of the conventional vertical probe devices.

To attain the above objective, the present invention provides an assembling method for a vertical probe device, which comprises the steps of:

a) providing a lower die having a plurality of needle holes and a plurality of jig holes, and a jig having an installing surface and a plurality of supporting columns each protruding over the installing surface and having a top surface;

b) disposing the lower die on the installing surface of the jig in a way that the supporting columns of the jig are inserted through the jig holes of the lower die, respectively;

c) disposing a positioning film on the top surfaces of the supporting columns;

d) fastening the positioning film to the jig by fastening elements;

e) installing a plurality of probe needles in a way that the probe needles pass through the positioning film and are inserted through the needle holes of the lower die, respectively;

f) fastening an upper die having a plurality of needle holes on the lower die in a way that the positioning film is located between the upper die and the lower die without contacting the upper die, and the probe needles are inserted through the needle holes of the upper die, respectively;

g) removing the fastening elements; and h) separating the jig from the lower die so that the vertical probe device is formed as a combination of the lower die, the positioning film, the probe needles and the upper die.

To attain the above objective, the present invention further provides a maintaining method for the vertical probe device formed by the aforesaid assembling method, which comprises the steps of:

a) disposing the vertical probe device on the jig in a way that the supporting columns of the jig are inserted through the jig holes of the lower die respectively, and the lower die is placed on the installing surface of the jig, such that the positioning film is located on the top surfaces of the supporting columns;

b) fastening the positioning film to the jig by the fastening elements; and c) separating the upper die from the lower die.

In the aforesaid assembling method, the positioning film is fastened to the jig in the step d) and unfastened from the jig in the step g), so the step of installing the probe needles, i.e. the step e) of the assembling method, and the step of installing the upper die, i.e. the step f) of the assembling method, are relatively easily performed since the positioning film is fastened to the jig in the process of the steps e) and f). After the vertical probe device is completely assembled, the positioning film is only connected with the probe needles, not fastened to any other element of the vertical probe device, and not in contact with the upper die, so that the positioning film is movable in a small distance between the upper and lower dies, thereby preventing the probe needles from overstress when contacting DUTs, so that the probe needles are relatively reliable. When the vertical probe device needs maintenance, such as replacement of the probe needles, the upper die can be removed temporarily by the aforesaid maintaining method, so that the follow-up maintaining actions can be performed. Because the positioning film has already been fastened to the jig before the upper die is removed, i.e. the step c) of the maintaining method, the positioning film is prevented from being lifted and flipped over along with the upper die while the upper die is removed. The aforesaid vertical probe device, jig and fastening elements are simple in structure. The assembling and maintaining methods are easy to be performed. Besides, the upper and lower dies can be provided with some reserved space for accommodating electronic components around the probe needles.

The present invention further provides a vertical probe device comprising a lower die having a plurality of needle holes and a plurality of jig holes, a plurality of probe needles each having a head, a body and a tail connected in order, an upper die having a plurality of needle holes, and a positioning film having a plurality of needle holes. The tails of the probe needles are inserted through the needle holes of the lower die, respectively. The upper die is fastened on the lower die. The heads of the probe needles are inserted through the needle holes of the upper die, respectively. The positioning film is located between the upper die and the lower die without contacting the upper die. The heads of the probe needles are inserted through the needle holes of the positioning film, respectively. The jig holes of the lower die are adapted for being inserted therethrough a plurality of supporting columns of a jig. As a result, the vertical probe device is able to perform the aforesaid assembling and maintaining methods so as to achieve the aforesaid effects.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
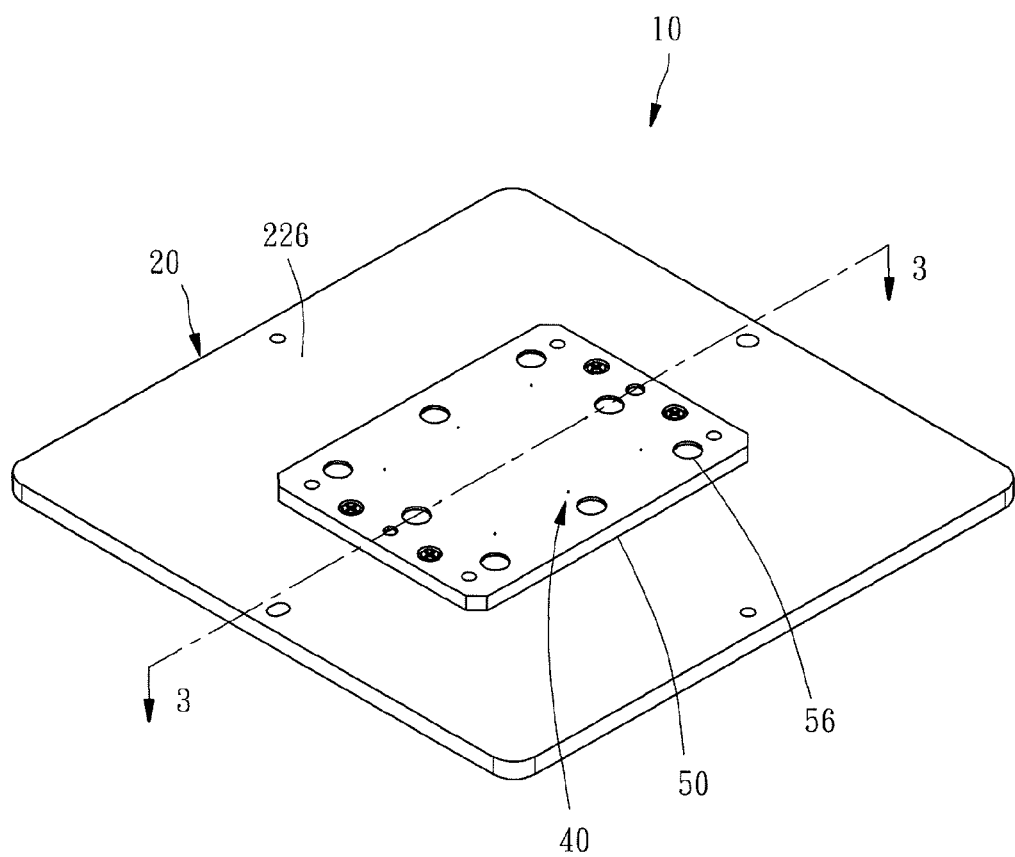
FIG. 1 is an assembled perspective view of a vertical probe device according to a preferred embodiment of the present invention.
Figure 2:
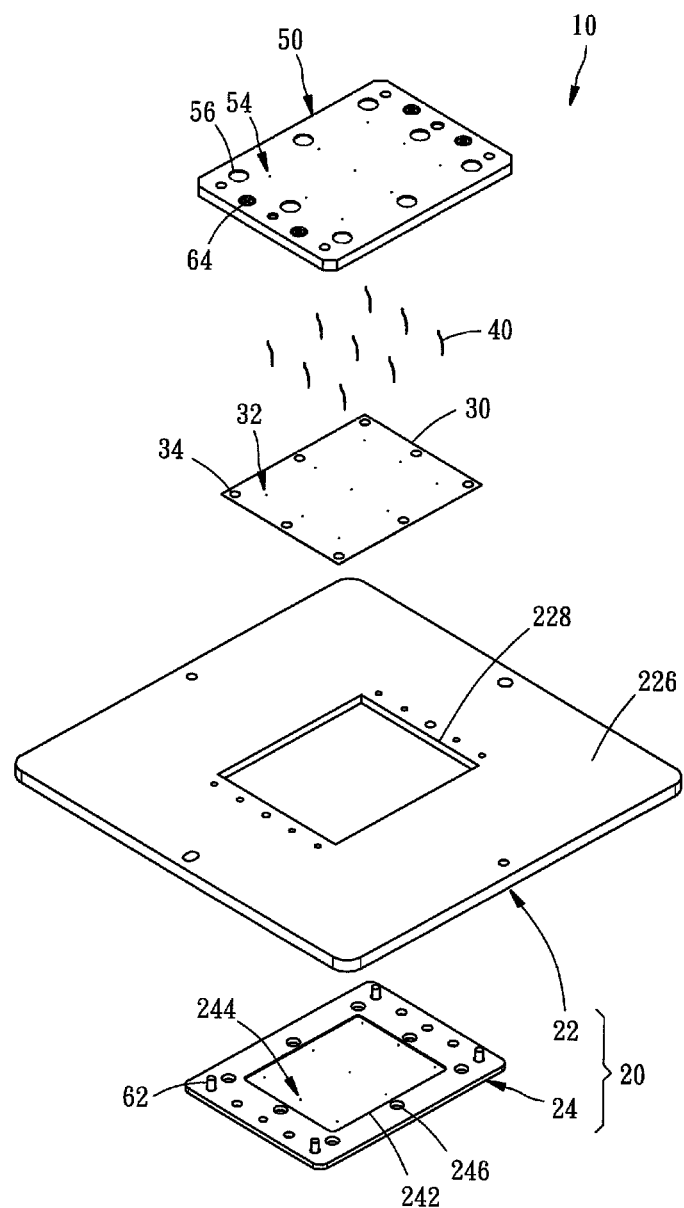
FIG. 2 is an exploded perspective view of the vertical probe device according to the preferred embodiment of the present invention.
Figure 3:
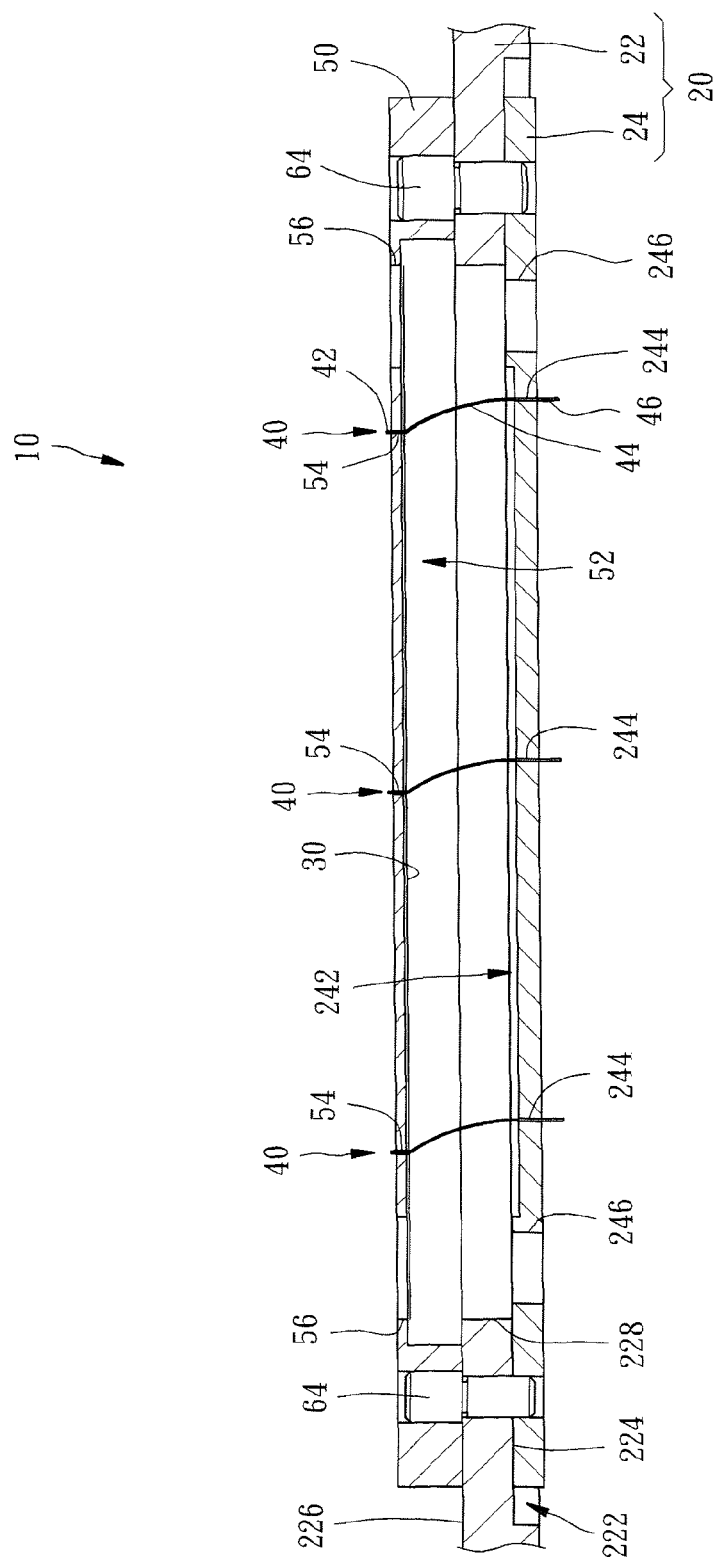
FIG. 3 is a sectional view taken along the line 3-3 in FIG. 1.

Referring to FIGS. 1-3, FIG. 1 is an assembled perspective view of a vertical probe device 10 according to a preferred embodiment of the present invention, FIG. 2 is an exploded perspective view of the vertical probe device 10, and FIG. 3 is a sectional view taken along the line 3-3 in FIG. 1. As shown in FIGS. 1-3, the vertical probe device 10 comprises a lower die 20, a positioning film 30, a plurality of probe needles 40, and an upper die 50. In this embodiment, the vertical probe device 10 comprises nine probe needles 40. However, the amount of the probe needles 40 is not limited.

In this embodiment, the lower die 20 comprises an upper member 22 and a lower member 24. The upper member 22 is provided with a recess 222 at the bottom thereof, a bottom surface 224 located in the recess 222, a top surface 226 opposite to the bottom surface 224, and a through hole 228 penetrating through the top surface 226 and the bottom surface 224. The lower member 24 is provided with a recess 242 at the top thereof, a plurality of needle holes 244 located at the recess 242 and penetrating through the lower member 24, and a plurality of jig holes 246 located around the recess 242 and penetrating through the lower member 24. The amount of the needle holes 244 is the same with the amount of the probe needles 40. In this embodiment, the lower die 20 has eight jig holes 246. However, the amount of the jig holes 246 is not limited. The lower member 24 is disposed in the recess 222 at the bottom of the upper member 22 and fastened on the bottom surface 224 of the upper member 22 by means of four screws 62. The needle holes 244 and the jig holes 246 are arranged to communicate with the through hole 228 of the upper member 22. It is to be understood that the lower die 20 is not limited to a two-piece configuration composed of upper and lower members 22, 24, but may be a one-piece configuration; in other words, the upper member 22 and the lower member 24 may be integrally made as a unitary member.

The positioning film 30 is a flexible, insulated thin sheet, which has a plurality of needle holes 32, and a plurality of fastening holes 34 located around the probe needles 32. The amount of the needle holes 32 is the same with the amount of the probe needles 40. The amount of the fastening holes 34 is the same with the amount of the jig holes 246.

Each probe needle 40 is a conventional vertical probe needle which has a head 42, a body 44 and a tail 46 connected in order. The head 42 and the tail 46 are shaped as straight cylinders and parallel to each other. The body 44 is curved in a way that the head 42 and the tail 46 located at two ends of the body 44 are not aligned with each other.

The upper die 50 is provided with a recess 52 at the bottom thereof, a plurality of needle holes 54 located at the recess 52 and penetrating through the upper die 50, and a plurality of auxiliary holes 56 located at the recess 52, penetrating through the upper die 50 and located around the needle holes 54. The amount of the needle holes 54 is the same with the amount of the probe needles 40. The amount of the auxiliary holes 56 is the same with the amount of the jig holes 246.

In the following contents, the vertical probe device 10 is instanced for illustrating an assembling method and a maintaining method provided by the present invention, and the connection between the elements of the vertical probe device 10 will be specified at the same time.

Figure 4:
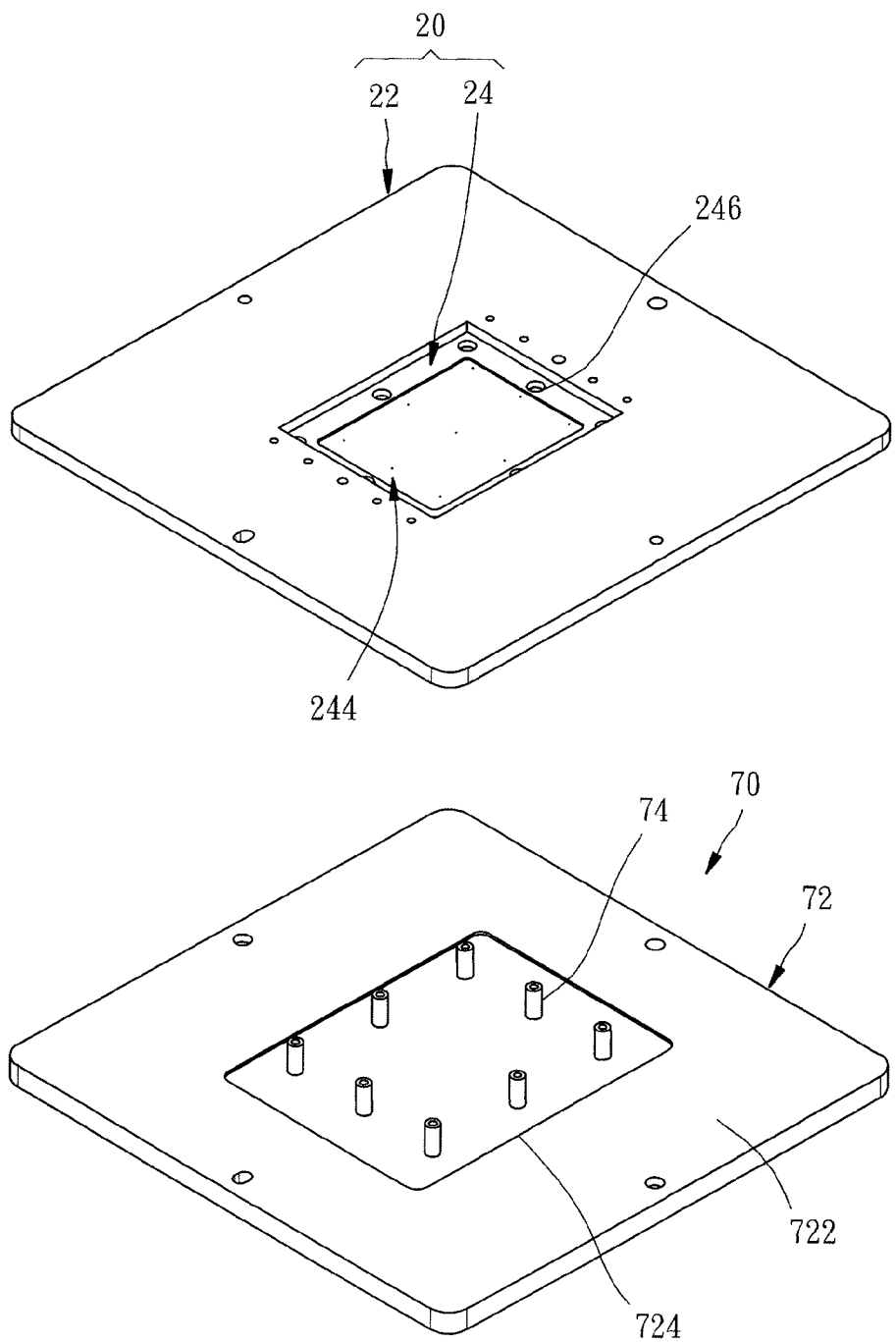
FIGS. 4-10 are perspective views showing steps of an assembling method for the vertical probe device according to the preferred embodiment of the present invention.
Figure 5:
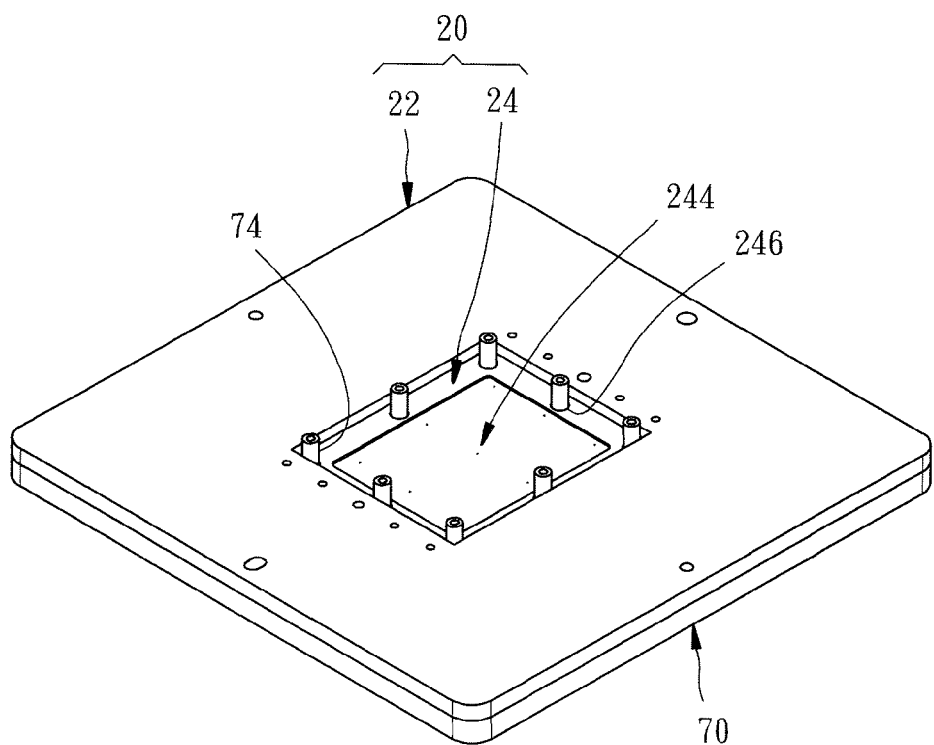
Figure 6:
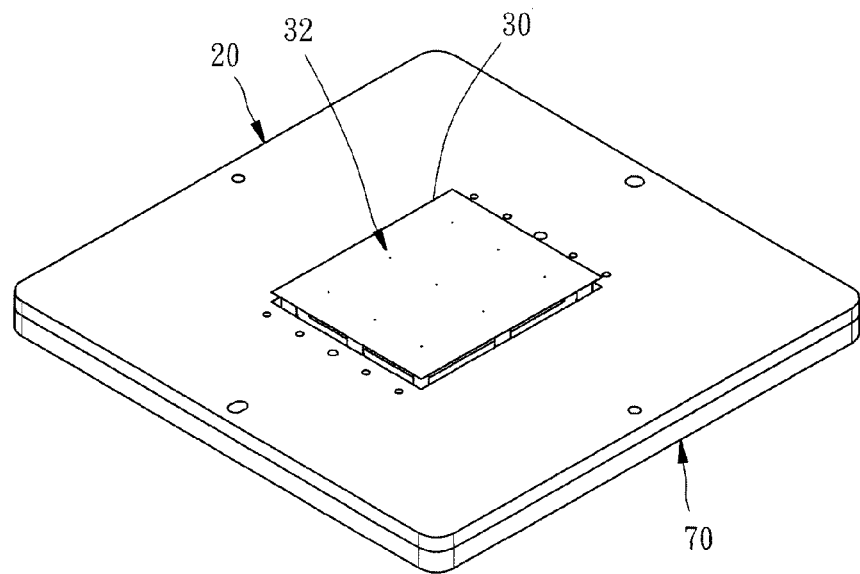
Figure 7:
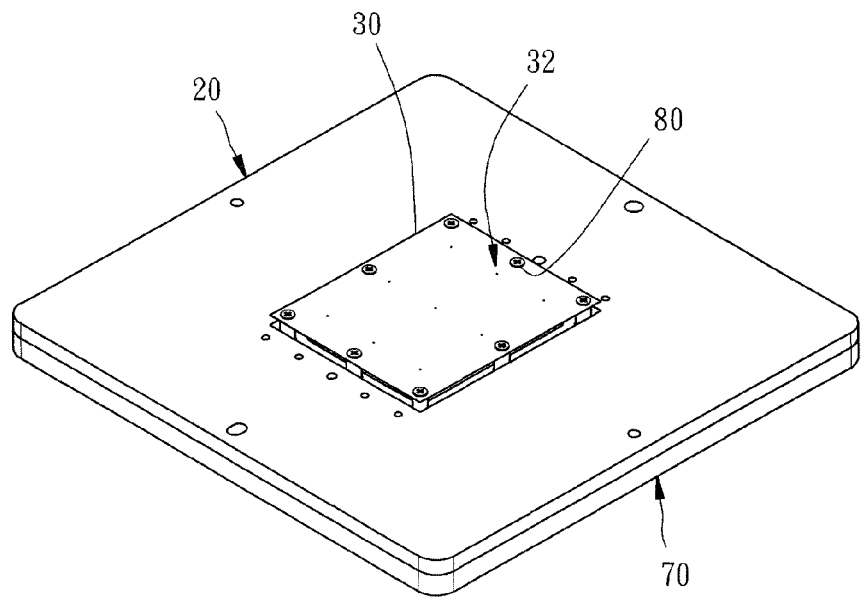
Figure 8:
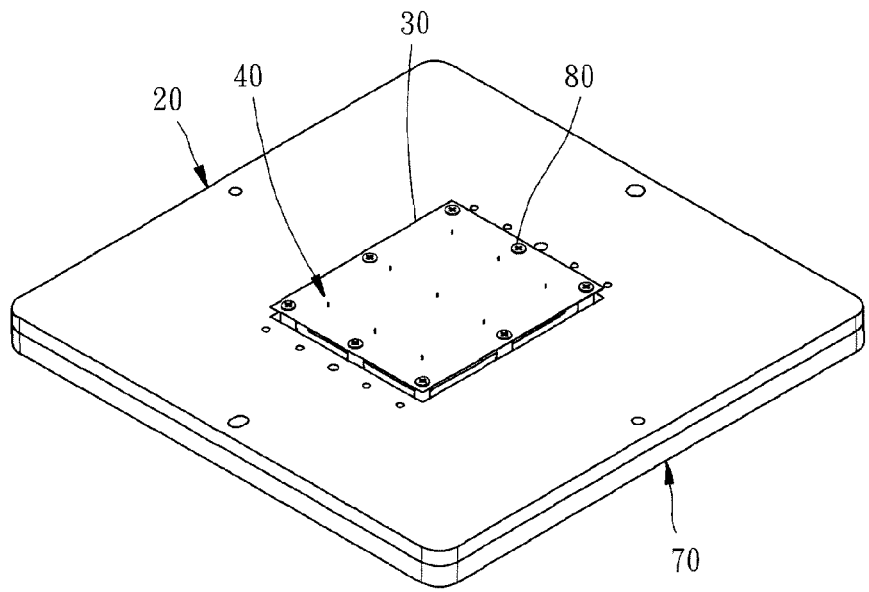
Figure 9:
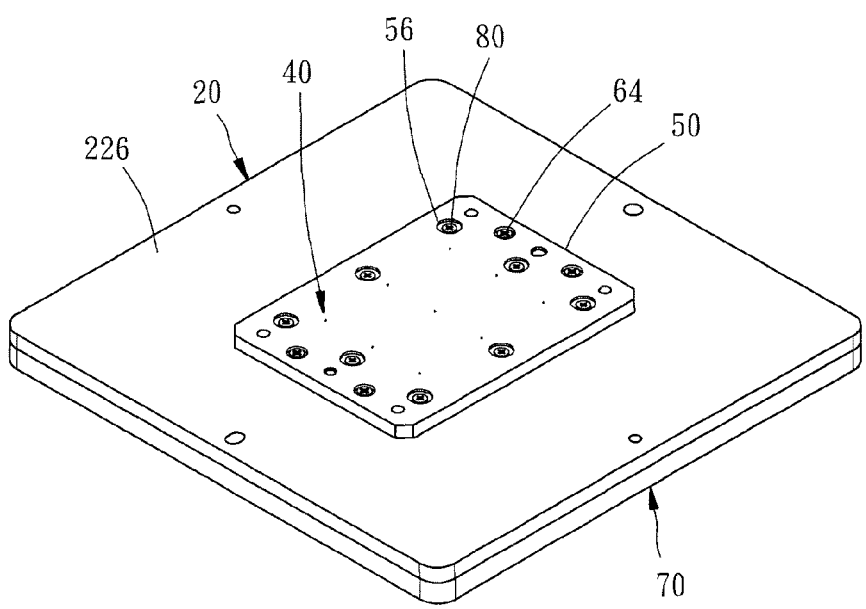
Figure 10:
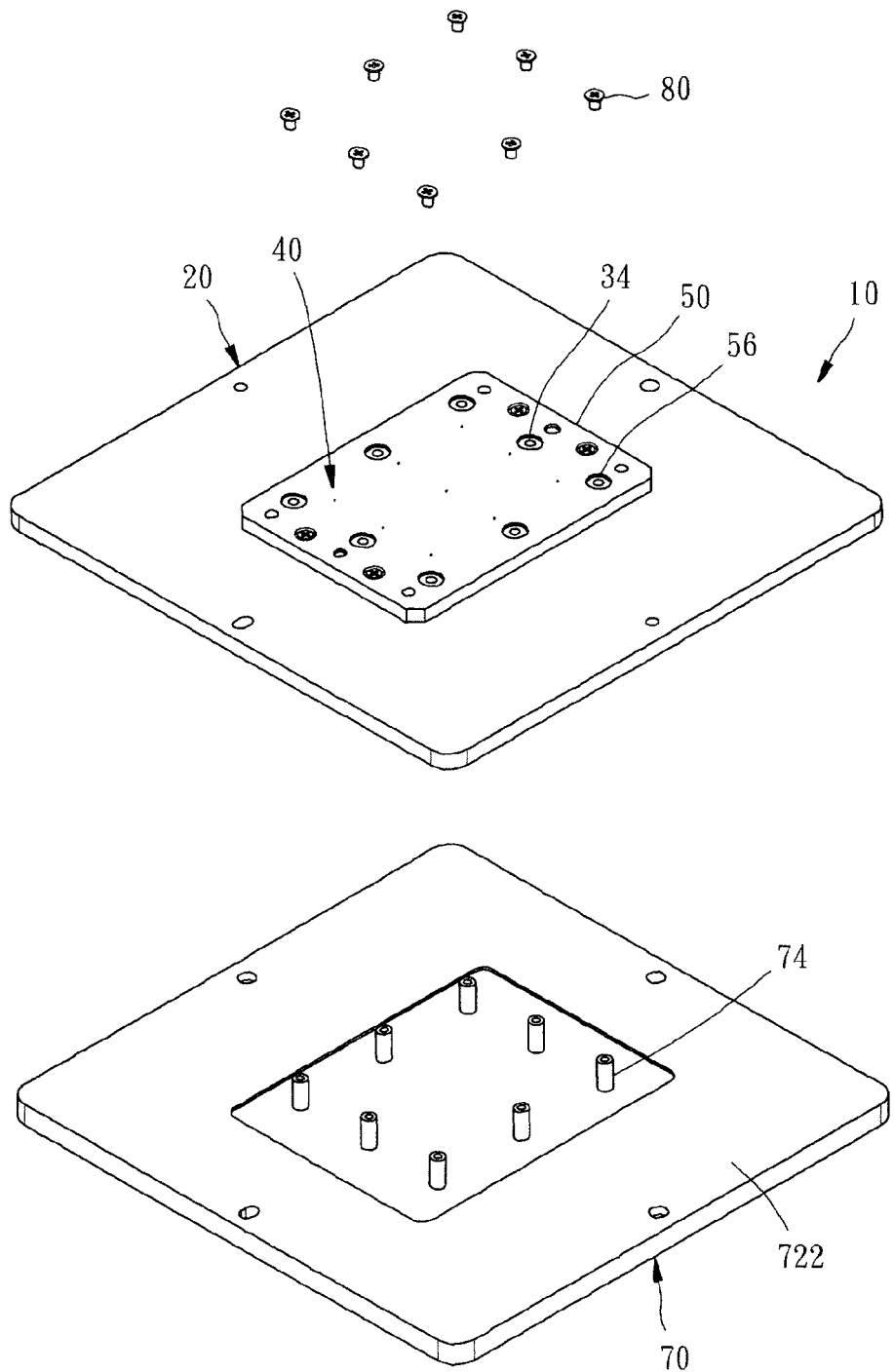
Figure 11:
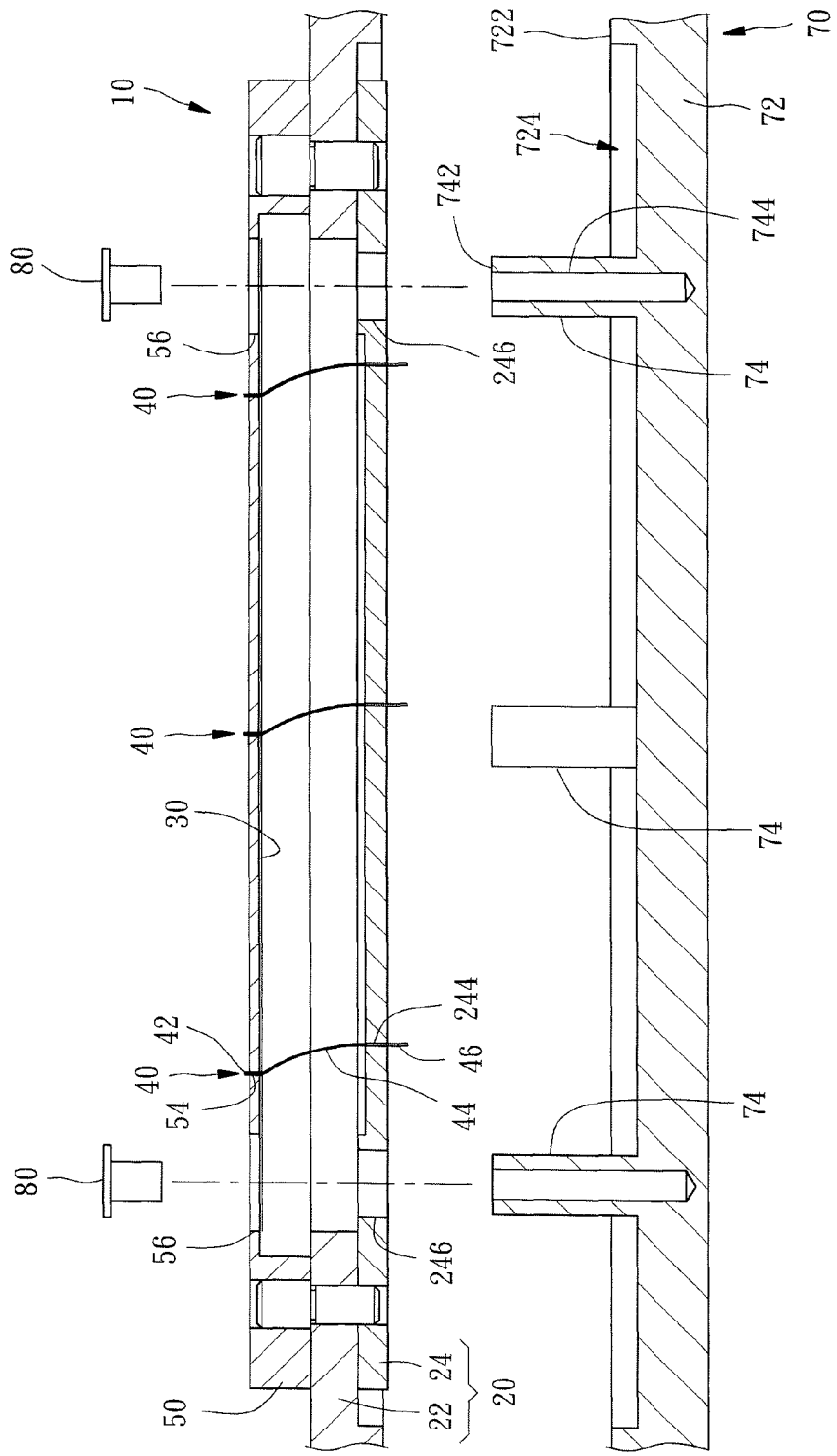
FIG. 11 is a sectional view of FIG. 10.

Referring to FIGS. 4-11, FIGS. 4-10 are perspective views showing the steps of the assembling method for the vertical probe device 10, and FIG. 11 is a sectional view of FIG. 10. The assembling method for the vertical probe device 10 comprises the following steps.

a) As shown in FIG. 4, provide the lower die 20 and a jig 70 which is made integrally with a plate 72 and a plurality of supporting columns 74. The plate 72 is provided with an installing surface 722 at the top thereof, and a recess 724 concaved from the installing surface 722. The supporting columns 74 protrude from a bottom surface of the recess 724 and over the installing surface 722. As shown in FIG. 11, each supporting column 74 has a top surface 742, and a fastening hole 744 opened on the top surface 742.

b) Dispose the lower die 20 on the installing surface 722 of the jig 70 in a way that the supporting columns 74 of the jig 70 are inserted through the jig holes 246 of the lower die 20 respectively, as shown in FIG. 5. After that, the lower die 20 and the jig 70 may, but not limited to, be fastened to each other by means of screws (not shown).

c) Dispose the positioning film 30 on the top surfaces 742 of the supporting columns 74, as shown in FIG. 6. At this time, the positioning film 30 may not yet have the fastening holes 34 as shown in FIG. 2, and the fastening holes 34 will be produced in the following step d). Alternatively, the fastening holes 34 of the positioning film 30 may be preformed before the step c) and be arranged correspondingly in position to the fastening holes 744 of the supporting columns 74 of the jig 70 respectively in the step c).

d) Fasten the positioning film 30 to the jig 70 by fastening means. In this embodiment, the fastening means comprises a plurality of fastening elements 80, as shown in FIG. 7; the step d) is carried out in a way that the fastening elements 80 penetrate through the positioning film 30 and are fixed in the fastening holes 744 of the supporting columns 74 respectively, so that the positioning film 30 is fastened to the jig 70. The fastening hole 744 of each supporting column 74 may, but not limited to, be a threaded hole, and each fastening element 80 may, but not limited to, be a screw; in other words, the positioning film 30 is fastened on the top surfaces 742 of the supporting columns 74 of the jig 70 by means of screws 80 in the step d). Alternatively, the fastening hole 744 of each supporting column 74 may be a through hole, and each fastening element 80 may comprise a bolt inserted in the fastening hole 744 from the bottom of the jig 70 to protrude over the top of the positioning film 30, and a nut disposed on the positioning film 30 and screwingly engaged with the bolt.

e) Install the probe needles 40 in a way that the probe needles 40 pass through the positioning film 30 and are inserted through the needle holes 244 of the lower die 20 respectively, so that an equipment as shown in FIG. 8 is formed. Specifically speaking, the step e) is carried out in a way that the tail 46 and the body 44 of each probe needle 40 pass through the needle hole 32 of the positioning film 30 in order so that the heads 42 of the probe needles 40 are inserted through the needle holes 32 respectively; meanwhile, the tails 46 of the probe needles 40 are inserted through the needle holes 244 of the lower die 20, respectively.

f) As shown in FIG. 9, fasten the upper die 50 on the lower die 20. In this embodiment, the upper die 50 is fastened on the top surface 226 of the lower die 20 by means of four screws 64 in a way that the positioning film 30 is located between the upper die 50 and the lower die 20 without contacting the upper die 50, and the heads 42 of the probe needles 40 are inserted through the needle holes 54 of the upper die 50, respectively. Besides, the auxiliary holes 56 of the upper die 50 are arranged to correspond in position to the jig holes 246 of the lower die 20 respectively so as to correspond in position to the supporting columns 74 respectively and correspond in position to the fastening elements 80 fixed to the supporting columns 74, respectively.

g) Remove the fastening means. In this embodiment, the step g) is carried out in a way that the fastening elements 80 are separated from the supporting columns 74 and removed through the auxiliary holes 56 of the upper die 50, as shown in FIGS. 10-11. After that, the positioning film 30 is no longer fastened to the jig 70, but supported between the lower die 20 and the upper die 50 by the probe needles 40.

h) As shown in FIGS. 10-11, separate the jig 70 from the lower die 20 so that the vertical probe device 10 is formed as a combination of the lower die 20, the positioning film 30, the probe needles 40 and the upper die 50.

It will be appreciated that the fastening element is not limited to the aforesaid screws 80 or an assembly of bolt and nut, but may be other kinds of fastener, such as an assembly of a magnet and a magnetic conductor or a vacuum suction device, as long as the fastening element can be used to fasten the positioning film 30 on the top surfaces 742 of the supporting columns 74 temporarily. Therefore, each supporting column 74 may be provided without such fastening hole 744, and the upper die 50 may be provided without such auxiliary holes 56.

In the aforesaid assembling method, the positioning film 30 is fastened to the Jig 70 in the step d) and unfastened from the jig 70 in the step g), so the step of installing the probe needles 40, i.e. the step e) of the assembling method, and the step of installing the upper die 50, i.e. the step f) of the assembling method, are relatively easily performed since the positioning film 30 is fastened to the jig 70 in the process of the steps e) and f).

The completely assembled vertical probe device 10 is adapted to be mounted to the bottom of a circuit board or space transformer (not shown) to form a probe card. The parts of the heads 42 of the probe needles 40, which protrude out of the upper die 50, are adapted for electrical connection with contacts of the circuit board or space transformer. The parts of the tails 46 of the probe needles 40, which protrude out of the lower die 20, are adapted for probing contacts of DUTs (not shown). In this circumstance, the positioning film 30 is only connected with the probe needles 40, not fastened to any other element of the vertical probe device 10, and not in contact with the upper die 50, so the positioning film 30 is movable in a small distance between the upper and lower dies 50 and 20, thereby preventing the probe needles 40 from overstress when contacting DUTs, so that the probe needles 40 are relatively less damageable.

Figure 12:
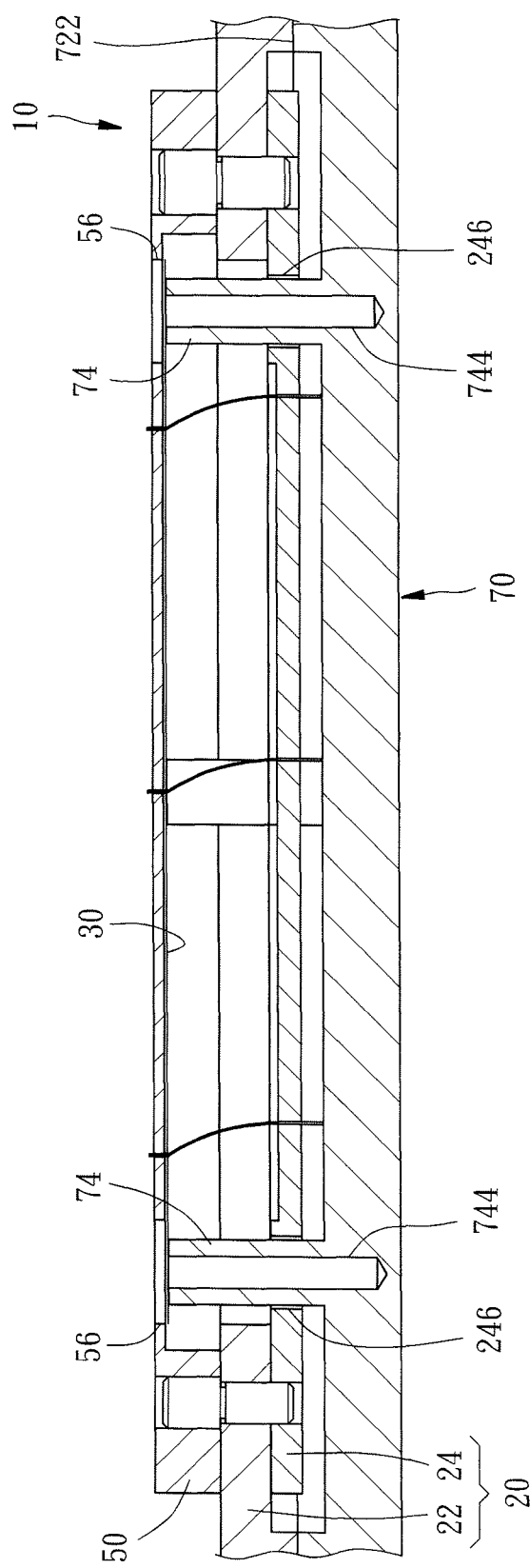
FIGS. 12-14 are sectional views showing steps of a maintaining method for the vertical probe device according to the preferred embodiment of the present invention.
Figure 13:
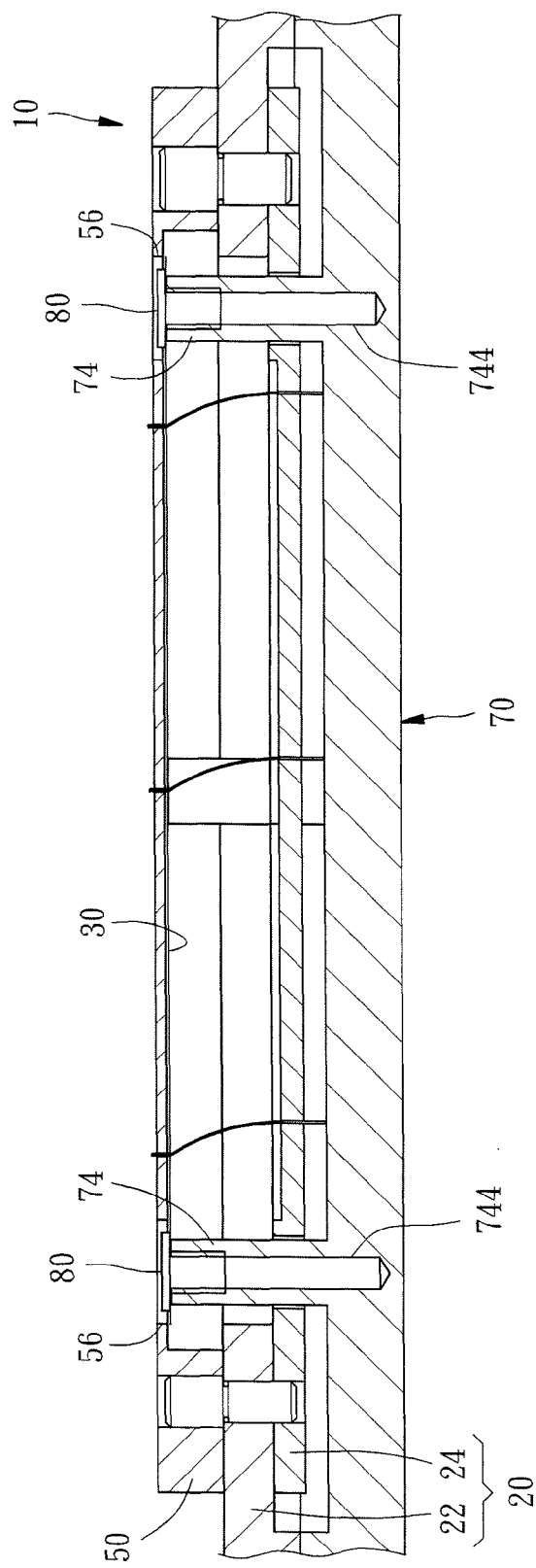
Figure 14:
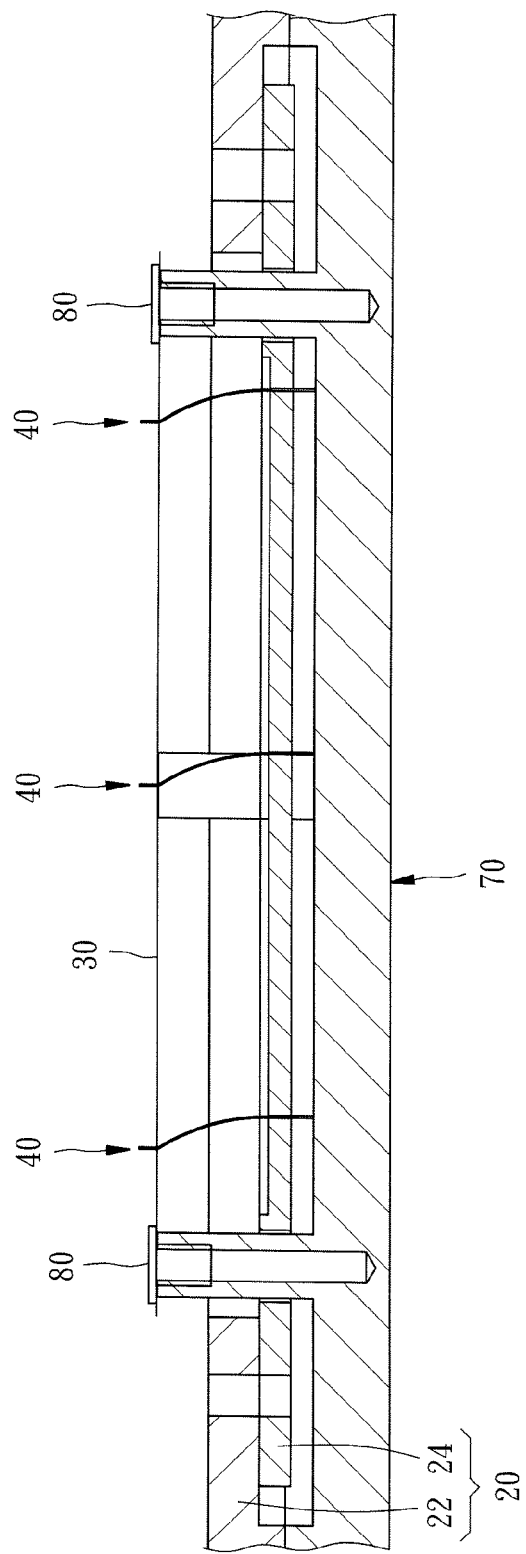

Referring to FIGS. 12-14 which are sectional views showing the steps of a maintaining method for the vertical probe device 10, when the vertical probe device 10 needs maintenance, such as replacement of the probe needles, the upper die 50 can be removed temporarily by the maintaining method, so that the follow-up maintaining actions can be performed. The maintaining method comprises the following steps.

a) As shown in FIG. 12, dispose the vertical probe device 10 on the jig 70 in a way that the supporting columns 74 of the jig 70 are inserted through the jig holes 246 of the lower die 20 respectively, and the lower die 20 is placed on the installing surface 722 of the jig 70, so that the positioning film 30 is located on the top surfaces 742 of the supporting columns 74. After that, the lower die 20 and the jig 70 may, but not limited to, be fastened to each other by means of screws (not shown).

b) Fasten the positioning film 30 to the jig 70 by the fastening means. As shown in FIG. 13, in this embodiment, the step b) is carried out in a way that the fastening elements 80 are inserted through the fastening holes 34 of the positioning film 30 through the auxiliary holes 56 of the upper die 50 respectively and fixed in the fastening holes 744 of the supporting columns 74 respectively, so that the positioning film 30 is fastened to the jig 70.

c) Separate the upper die 50 from the lower die 20, so that the equipment as shown in FIG. 14 is formed. In the step c), the positioning film 30 is fastened to the jig 70 so as to be prevented from being lifted and flipped over along with the upper die 50 while the upper die 50 is removed, and the probe needles 40 are prevented from being pulled up at the same time.

Figure 15:
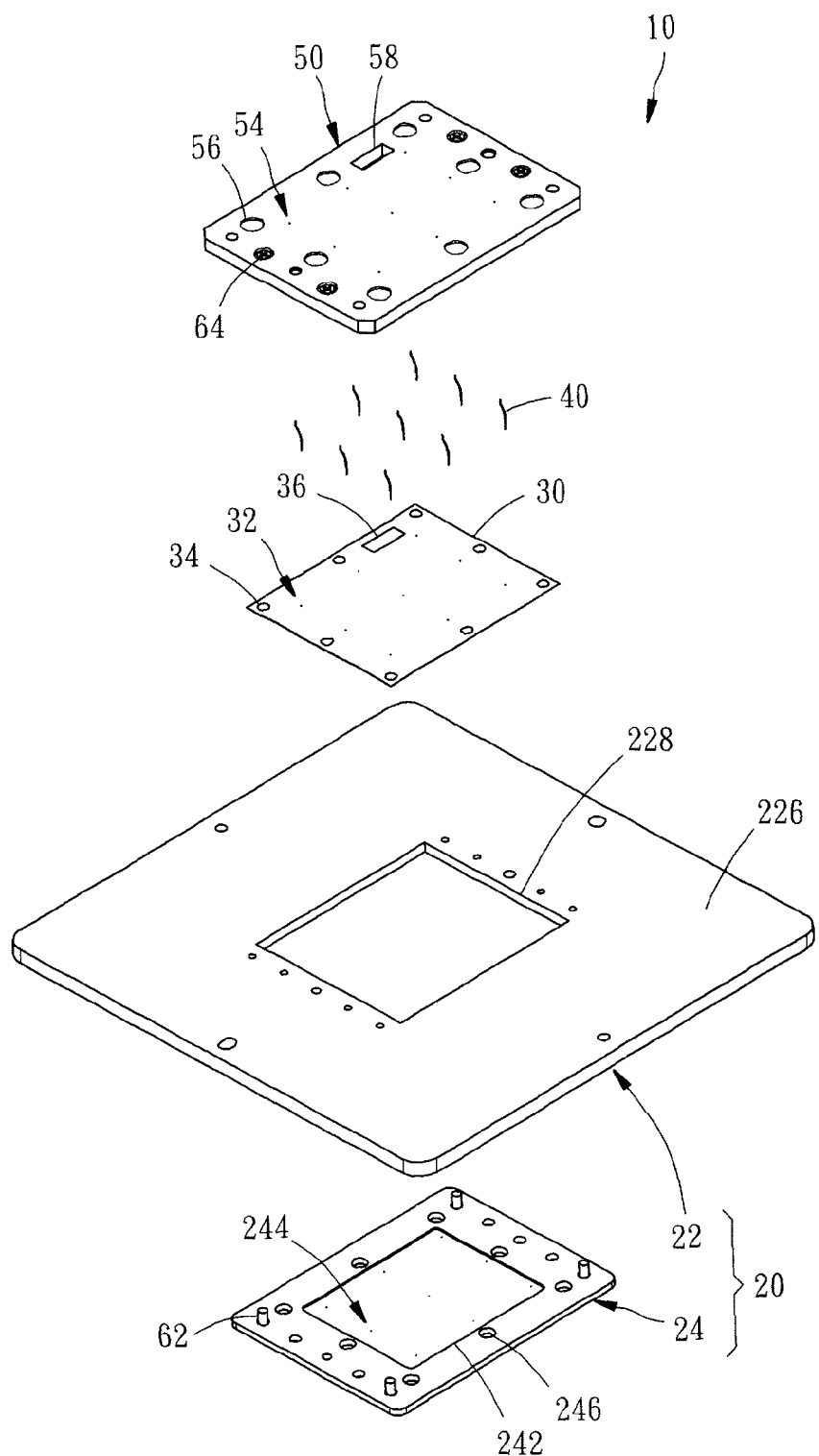
FIG. 15 is similar to FIG. 2, but the vertical probe device in FIG. 15 is provided with an additional accommodating hole at an upper die thereof and an additional through hole at a positioning film thereof, in which the additional accommodating hole and the additional through hole correspond in position to each other.

According to the above contents, the vertical probe device 10, the jig 70 and the fastening elements 80 are simple in structure, and the assembling and maintaining methods are easily performed. Although the upper and lower dies 50 and 20 have the auxiliary holes 56 and the jig holes 246 located around the probe needles 40 for the installation of the jig 70 and the fastening elements 80, the jig 70 and the fastening elements 80 are not installed in the vertical probe device 10 when the device 10 is in use. Therefore, if the circuit board or space transformer mounted on the top of the vertical probe device 10 is provided with an electronic component (not shown) protruding downwards into the device 10, the auxiliary holes 56 of the upper die 50 can be used to accommodate the electronic component, and the electronic component can further be inserted in the fastening holes 34 of the positioning film 30. As shown in FIG. 15, the upper die 50 may have an additional accommodating hole 58 for accommodating electronic component(s), and the positioning film 30 may have an additional through hole 36 corresponding in position to the accommodating hole 58 for insertion of the electronic component(s). In other words, the configuration of the vertical probe device of the present invention can be provided with some reserved space for accommodating electronic components around the probe needles 40, so the vertical probe device of the present invention is applicable in the situation that the top thereof should accommodate electronic components.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An assembling method for a vertical probe device, which comprises the steps of:
   a) providing a lower die having a plurality of needle holes and a plurality of jig holes, and a jig having an installing surface and a plurality of supporting columns each protruding over the installing surface and having a top surface;
   b) disposing the lower die on the installing surface of the jig in a way that the supporting columns of the jig are inserted through the jig holes of the lower die respectively;
   c) disposing a positioning film on the top surfaces of the supporting columns;
   d) fastening the positioning film to the jig by fastening elements;
   e) installing a plurality of probe needles in a way that the probe needles pass through the positioning film and are inserted through the needle holes of the lower die respectively;
   f) fastening an upper die having a plurality of needle holes on the lower die in a way that the positioning film is located between the upper die and the lower die without contacting the upper die, and the probe needles are inserted through the needle holes of the upper die respectively;
   g) removing the fastening elements; and
   h) separating the jig from the lower die so that the vertical probe device is formed as a combination of the lower die, the positioning film, the probe needles and the upper die.

2. The assembling method as claimed in claim 1, wherein each of the supporting columns of the jig has a fastening hole opened on the top surface thereof; the step d) is carried out in a way that the fastening elements pass through the positioning film and are fixed in the fastening holes of the supporting columns respectively, so that the positioning film is fastened to the jig; the upper die has a plurality of auxiliary holes corresponding in position to the jig holes of the lower die respectively; the step g) is carried out in a way that the fastening elements are separated from the supporting columns and removed through the auxiliary holes of the upper die.

3. The assembling method as claimed in claim 2, wherein each of the fastening holes of the supporting columns of the jig is a threaded hole; each of the fastening elements is a screw.

4. The assembling method as claimed in claim 2, wherein at least one of the auxiliary holes of the upper die is adapted to accommodate an electronic component.

5. The assembling method as claimed in claim 1, wherein the lower die comprises an upper member having a top surface, a bottom surface and a through hole penetrating through the top surface and the bottom surface, and a lower member fastened on the bottom surface of the upper member; the upper die is fastened on the top surface of the upper member; the needle holes and the jig holes of the lower die are provided at the lower member and arranged to communicate with the through hole of the upper member.

6. The assembling method as claimed in claim 5, wherein the upper member and the lower member of the lower die are integrally made as a unitary member.

7. The assembling method as claimed in claim 1, wherein the upper die further has an accommodating hole for accommodating an electronic component.

8. A maintaining method for the vertical probe device formed by the assembling method as claimed in claim 1, which comprises steps of:
   a) disposing the vertical probe device on the jig in a way that the supporting columns of the jig are inserted through the jig holes of the lower die respectively, and the lower die is placed on the installing surface of the jig, so that the positioning film is located on the top surfaces of the supporting columns;

b) fastening the positioning film to the jig by the fastening elements; and c) separating the upper die from the lower die.

9. The maintaining method as claimed in claim 8, wherein each of the supporting columns of the jig has a fastening hole opened on the top surface thereof; the upper die has a plurality of auxiliary holes corresponding in position to the jig holes of the lower die respectively; the step b) of the maintaining method is carried out in a way that the fastening elements pass through the positioning film through the auxiliary holes of the upper die respectively and fixed in the fastening holes of the supporting columns respectively, so that the positioning film is fastened to the jig.

* * * * *